(12) United States Patent
Sullivan

(10) Patent No.: US 10,191,353 B2
(45) Date of Patent: Jan. 29, 2019

(54) OPTICALLY TRIGGERED ELECTRICAL SWITCHES WITH FAST RECOVERY BASED ON NONLINEAR OPTICAL RESPONSE

(71) Applicant: Lawrence Livermore National Security, LLC, Livermore, CA (US)

(72) Inventor: James S. Sullivan, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 97 days.

(21) Appl. No.: 15/472,818

(22) Filed: Mar. 29, 2017

(65) Prior Publication Data

US 2018/0284565 A1 Oct. 4, 2018

(51) Int. Cl.
*H01J 40/14* (2006.01)
*G02F 1/35* (2006.01)
*H03K 17/78* (2006.01)

(52) U.S. Cl.
CPC .......... *G02F 1/3515* (2013.01); *G02F 1/3501* (2013.01); *H03K 17/78* (2013.01); *G02F 2202/101* (2013.01)

(58) Field of Classification Search
CPC ........ H01L 21/268; H01L 21/428; H01S 3/10
USPC .......................................... 250/214 R, 214.1
See application file for complete search history.

(56) References Cited

U.S. PATENT DOCUMENTS

| 5,912,455 | A * | 6/1999 | Pocholle | H03K 17/78 |
| | | | | 250/214 R |
| 7,893,541 | B2 | 2/2011 | Caporaso et al. | |
| 8,125,089 | B2 | 2/2012 | Caporaso et al. | |
| 2014/0051191 | A1* | 2/2014 | Van Stryland | H01L 21/268 |
| | | | | 438/17 |

OTHER PUBLICATIONS

Cirloganu, Claudiu M. et al., "Extremely nondegenerate two-photon absorption in direct gap semiconductors", Optics Express, vol. 19, No. 23, (2011), 10 pages.
Sun, C-K. , et al., "Two-photon absorption study of GaN", Applied Physics Letters, vol. 76, No. 4, (2000), 4 pages.
Huang, Y-L. et al., "Femtosecond Z-scan measurement of GaN", Applied Physics Letters, vol. 75, No. 22, (1999), 4 pages.
Pacebutas, V. et al., "Photoconductive Z-scan measurement of multiphoton absorption in GaN", Journal of Applied Physics, vol. 92, No. 11, (2002), 4 pages.
Sullivan, J. and Stanley, J. "6H-Sic Photoconductive Switches Triggered At Below Bandgap Wavelengths", IEEE Trans. Dielectr. Electr. Insul., vol. 14, No. 4, Aug. 2007, pp. 980-985.

(Continued)

*Primary Examiner* — Kevin Pyo
(74) *Attorney, Agent, or Firm* — Harness, Dickey & Pierce

(57) ABSTRACT

An optical switch is disclosed which is electrically activatable through received photon energy. The switch may include a substrate responsive to photon energy that forms an optical excitation signal. First and second electrodes may be disposed on first and second surfaces of the substrate. The substrate may have a characteristic of two-photon absorption to enable electrical conduction through the substrate, the two-photon absorption being enhanced by deep energy levels located in a bandgap between conductance and valence bands of the substrate, which are at least near resonant with the photon energy.

19 Claims, 5 Drawing Sheets

(56) References Cited

OTHER PUBLICATIONS

Sullivan, J. and Stanley, J. "Wide Bandgap Extrinsic Photoconductive Switches", IEEE Transactions on Plasma Science, vol. 36, No. 5, Oct. 2008, pp. 2528-2532.
Sulivan, J. "High power operation of a nitrogen doped, vanadium compensated, 6H-SiC extrinsic photoconductive switch", Applied Physics Letters, 104, 172106 (2014), 5 pages.

* cited by examiner

OPTICALLY TRIGGERED ELECTRICAL SWITCHES WITH FAST RECOVERY BASED ON NONLINEAR OPTICAL RESPONSE

FIELD

The present disclosure relates to optically activated switches, and more particularly to an optically activated switch making use of enhanced two-photon absorption and opposing electrode geometry.

BACKGROUND

This section provides background information related to the present disclosure which is not necessarily prior art.

Optical switches have been pursued for compact, high voltage, high current, short pulse switching applications since the early 1970's. Switch development has focused on using semiconductor materials as photoconductors. Charge carriers are generated in the semiconductor material by applying optical excitation with photon energies that are greater than, or less than, the bandgap of the semiconductor.

With intrinsic photoconductive switches, electron-hole pairs are generated when a semiconductor is illuminated with above bandgap light. An optical transition that generates an electron-hole pair is shown in the simplified band diagram of FIG. 1. A photon with energy, $\hbar\omega$, greater than or equal to the bandgap ($E_g$), will be absorbed and excite an electron from the valence band to the conduction band, leaving a hole in the valence band. The number of charge carriers generated in the semiconductor material is proportional to the number of photons absorbed. Unfortunately, above bandgap light is rapidly absorbed in the material leading to a shallow optical penetration depth (on the order of 10's of microns). As a result, the switch conductivity is high in a thin layer at the surface of the switch material.

Photoconductive switches excited by photons with energy greater than the switch material bandgap are usually constructed in the lateral geometry of FIG. 2. FIG. 2 shows the optical excitation being applied to the surface of a semi-insulating semiconductor between a switch anode metallization layer and a cathode metallization layer, which form the two electrodes for the switch. The shallow penetration of light requires the switch electrodes to be positioned on the same surface of a switch substrate that is thicker than the optical penetration depth. The ultimate performance of a lateral switch, such as shown in FIG. 2, is limited by surface flashover and surface recombination. However, switches using above bandgap light have the advantage that the switch conductivity will be a linear function of applied optical power and there will be no saturation of carrier density due to the wealth of electron (holes) residing in the conduction (valence) band of the switch. There are also nonlinear versions of the lateral switch constructed from GaAs that use low intensity, above bandgap optical excitation to generate a small number of electron-hole pairs that induce an avalanche breakdown in the switch material termed "Lock-on".

Extrinsic photoconductive switches are switches in which photons with energy less than the switch material bandgap can excite electrons (holes) from energy levels located in the bandgap into the conduction band (valence band). This type of photoconductive switch is called an "extrinsic" switch since carrier generation is dependent on the density of impurity and defect energy levels in the switch material. The operating principle of an extrinsic photoconductive switch is shown in FIG. 3. Photons with energy $\hbar\omega<E_g/2$ can excite electrons (holes) trapped in acceptor (donor) levels into the conduction band. In addition, photons with energy $\geq E_g/2$ generate electrons (holes) in the conduction (valence) band via two-step optical transitions. An advantage of the extrinsic photoconductive switch is the deeper penetration of the below bandgap light into the switch substrate. Penetration depths of several millimeters to a centimeter or two are possible. This allows switch geometries where the switch contacts are mounted on opposing sides of the switch substrate as shown in FIG. 4. The switch design depicted in FIG. 4 allows for a larger volume of the switch material to carry current and the switch breakdown voltage will be determined by the bulk properties of the switch material. These advantages are offset by the limited number of charge carriers available from extrinsic levels and the requirement that the switch material have mid-band traps to enable two-step optical transitions. Additional doping is required to achieve low "on" resistances (~1 ohm). The increased doping will create additional energy levels in the bandgap. This increased doping can decrease the switch recovery time by introducing additional deep levels that act as carrier traps. However, the increased doping can increase the switch recovery time if the dopant introduces shallow donor levels that fill existing deep levels with donated electrons. As a result, it is difficult to simultaneously achieve very low "on" resistance and rapid switch recovery.

SUMMARY

This section provides a general summary of the disclosure, and is not a comprehensive disclosure of its full scope or all of its features.

In one aspect the present disclosure relates to an optical switch which is electrically activatable through received photon energy. The switch may comprise a substrate responsive to photon energy, where the photon energy forms an optical excitation signal; a first electrode disposed on a first surface of the substrate; and a second electrode disposed on a second surface of the substrate. The substrate may include a characteristic of two-photon absorption to enable electrical conduction through the substrate. The two-photon absorption may be enhanced by deep energy levels located in a bandgap between conductance and valence bands of the substrate which are at least near resonant with the photon energy.

In another aspect the present disclosure relates to a non-linear optical switch which is electrically activatable through received photon energy. The switch may comprise a substrate responsive to photon energy, where the photon energy forms an optical excitation signal; a first electrode disposed on a first surface of the substrate; and a second electrode disposed on a second surface of the substrate. The substrate may include a characteristic of two-photon absorption to enable electrical conduction through the substrate, the two-photon absorption being enhanced by deep energy levels located in a bandgap between conductance and valence bands of the substrate which are at least near resonant with the photon energy. The substrate may also comprise a doping which is selected to obtain a predetermined recombination time for the switch.

In still another aspect the present disclosure relates to a method for forming an optical switch electrically activatable through received photon energy. The method may comprise providing a substrate responsive to photon energy, where the photon energy forms an optical excitation signal. The method may further comprise forming a first electrode on a first surface of the substrate, and forming a second electrode on a second surface of the substrate. The method may further comprise forming the substrate such that the substrate includes a characteristic of two-photon absorption to enable electrical conduction through the substrate. The method may further comprise enhancing the two-photon absorption of the substrate by deep energy levels located in a bandgap between conductance and valence bands of the substrate which are at least near resonant with the photon energy.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 1:
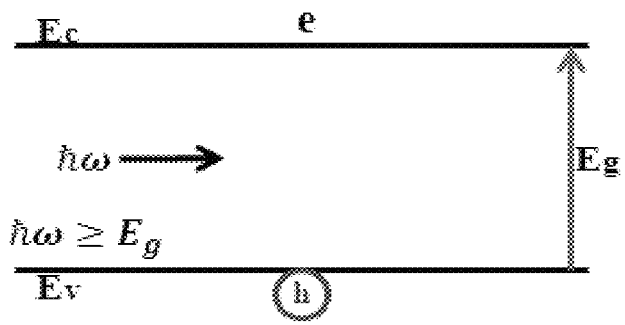
FIG. 1 illustrates a diagram showing electron-hole pairs that are generated when a semiconductor is illuminated with above bandgap light.
Figure 2:
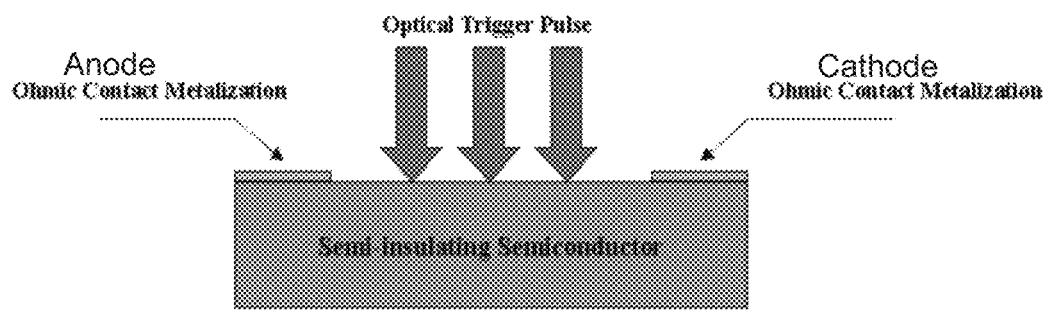
FIG. 2 illustrates a photoconductive switch having a lateral geometry in which the switch is excited by photons with energy greater than the switch material bandgap, and showing the optical excitation being applied to the surface of a semi-insulating semiconductor between a first metallization forming an anode and a second metallization forming a cathode.
Figure 3:
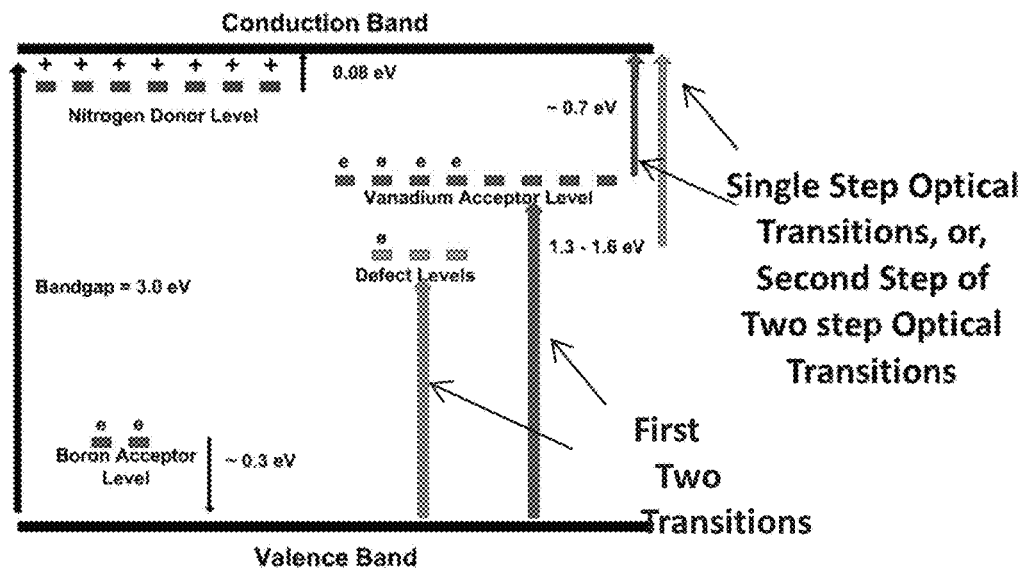
FIG. 3 is a diagram illustrating the operating principle of an extrinsic photoconductive switch, where the switch is based on a 6H—SiC material substrate.
Figure 4:
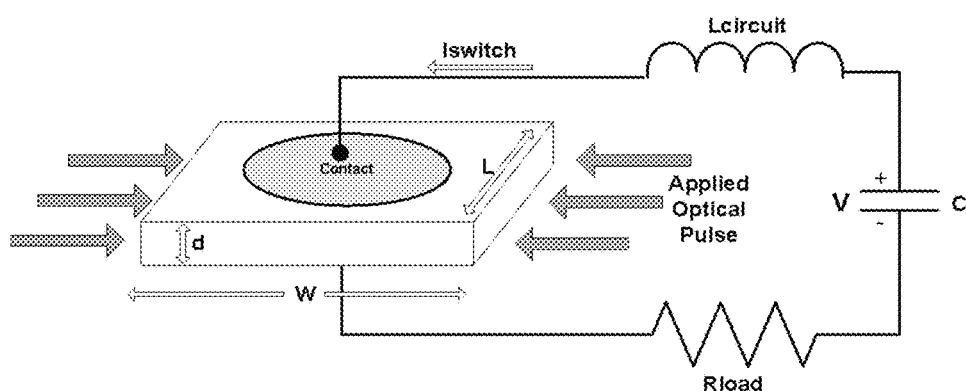
FIG. 4 shows a high-level diagram of a switch geometry in which the switch contacts are mounted on opposing sides of the switch substrate as shown in FIG. 4, which allows for a larger volume of the switch material to carry current, with the result that the switch breakdown voltage will be determined by the bulk properties of the switch material.
Figure 5:
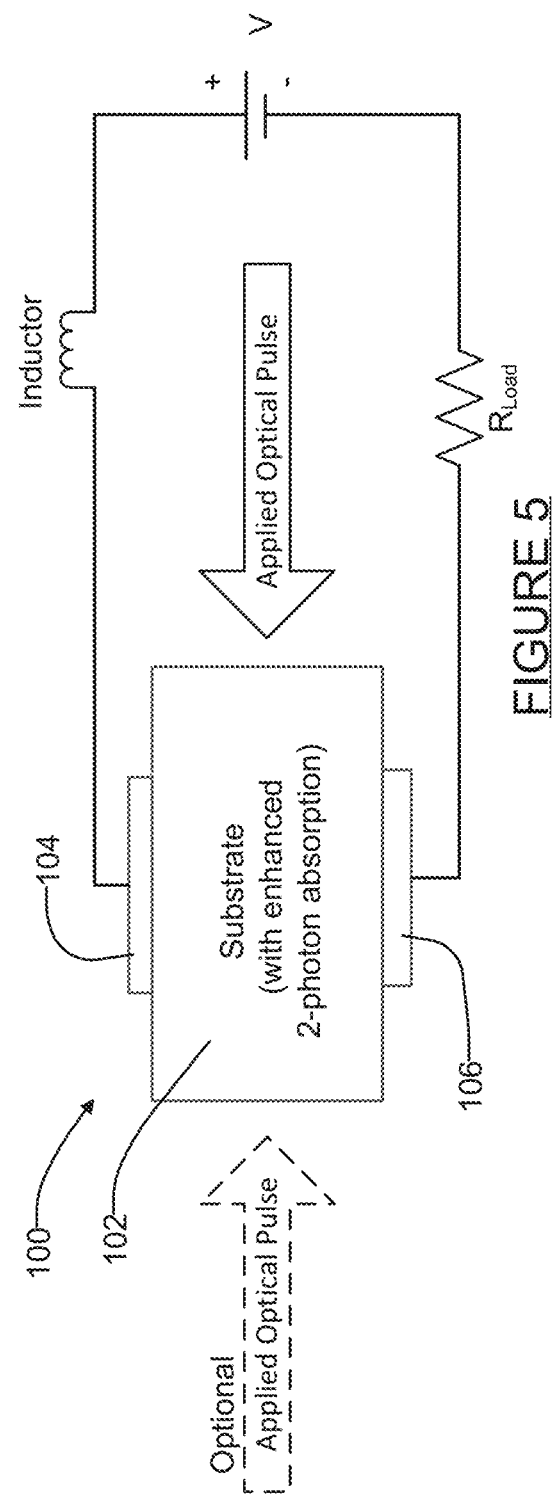
FIG. 5 shows one example of an optically activated switch in accordance with the present disclosure that makes use of a substrate having the characteristic of two-photon absorption.
Figure 7:
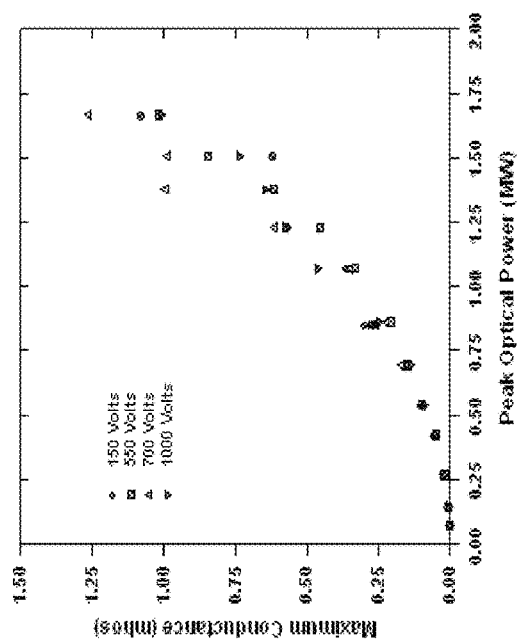
Figure 8:
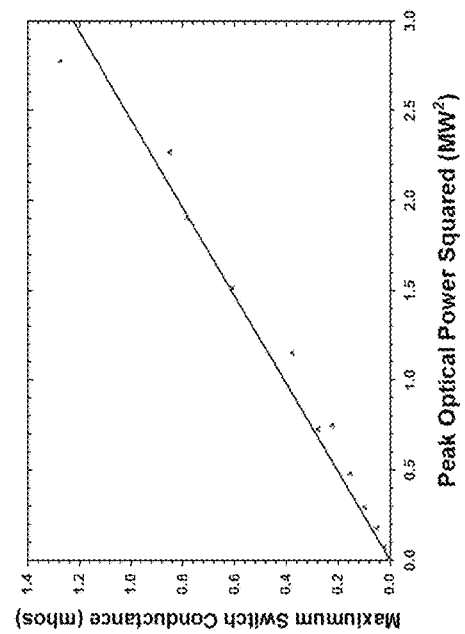

FIG. 7 is a graph showing maximum switch conductance plotted as a function of applied optical intensity at 532 nm, for an optical switch based on two-photon absorption constructed from a semi-insulating, 2H—GaN substrate, and having opposing electrodes similar to the switch geometry shown in FIG. 4; and FIG. 8 is a graph of maximum switch conductance versus peak optical power squared for an optical switch, such as shown in FIG. 5, based on two-photon absorption;

Corresponding reference numerals indicate corresponding parts throughout the several views of the drawings.

DETAILED DESCRIPTION

Example embodiments will now be described more fully with reference to the accompanying drawings.

The present disclosure relates to a new type of optically activated electrical switch in which the switch conductivity may be controlled by the generation of carriers via enhanced two-photon absorption. Two-photon absorption is a non-linear optical property of a material. As a result, it is an intrinsic property of the material. Two-photon absorption does not rely on the presence of extrinsic energy levels in the material bandgap; nor does it rely on the application of photons with energy greater than the material bandgap. An optically activated switch based on enhanced two-photon absorption can be constructed in an opposing electrode geometry to take advantage of the deep penetration depth of below bandgap light, and the intrinsic/extrinsic levels in the material bandgap can be tailored to obtain the desired recombination time for the switch. Consequently, optical switches based on carrier generation via enhanced two-photon absorption have significant advantages over both extrinsic and intrinsic photoconductive switches. The advantages of switches based on two-photon absorption become apparent in switching applications where low "on" resistance and ultra-fast switch recovery are required.

An optically triggered electrical switch based on enhanced two-photon absorption may be constructed in a similar fashion to that depicted in FIG. 4. FIG. 5 shows one example of an optically triggered switch 100 having a substrate 102 made from a material having a characteristic of two-photon absorption. Electrodes 104 and 106, forming metallized layers, are formed on opposing surfaces of the substrate 102 and the photon energy (i.e., optical excitation or input signal) is applied to at least one of the switch facets. It will be appreciated that the term "switch facets" as used herein are any one of the four un-metalized sides of the switch. The electrodes 104 and 106 (metallized layers) in this example are applied to the large faces of the substrate 102. The remaining four sides of the substrate 102 are facets.

In FIG. 5 an optional optical excitation signal, indicated by dashed lines, may also be applied to an opposing surface of the substrate 102. The material of the switch substrate 102 and the wavelengths of the applied optical excitation may be selected to enhance or maximize two-photon absorption in the switch substrate. Two-photon absorption is only possible in a material when the sum of the energy of two photons, $\hbar\omega_1+\hbar\omega_2$, is greater than the bandgap ($E_g$). Two-photon absorption in a solid occurs when two phase coherent photons are simultaneously absorbed by a valence band electron. The electron is excited to an energy equal to the sum of the photon energies. As a result, the valence electron is excited into the conduction band, leaving a hole behind in the valence band. Two-photon absorption creates electron-hole pairs. There is little concern of switch saturation since electrons are plentiful in the valence band.

Figure 6:
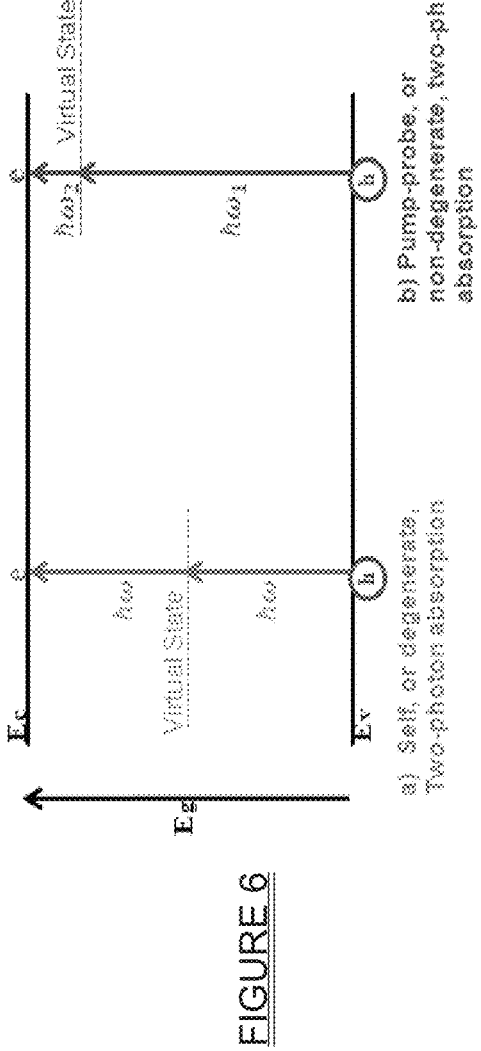
FIG. 6 shows a diagram illustrating two possible forms of two photon absorption, Part a) illustrating self or "degenerate" two-photon absorption, and Part b) showing pump-probe or "non-degenerate" two-photon absorption.

FIG. 6 shows two possible forms of two-photon absorption. Part a) of FIG. 6 shows self or "degenerate" two-photon absorption. Self-two-photon absorption occurs when two photons from the same optical beam, oscillating at frequency $\omega$, with $2\hbar\omega \geq E_g$, are simultaneously absorbed and a valence electron makes the transition to the conduction band leaving a hole in the valence band. Part b) of FIG. 6 shows pump-probe, or non-degenerate, two-photon absorption. Pump-probe two-photon absorption occurs when photons are absorbed from two different optical fields oscillating at frequencies $\omega_1$ and $\omega_2$, with the sum of the photon energies greater than $E_g$ ($\hbar(\omega_1+\omega_2) \geq E_g$). Pump-probe two-photon absorption excites an electron from the valence band to the conduction band leaving a hole in the valence band. There is a special case of non-degenerate two-photon absorption named "extremely non-degenerate" two-photon absorption (i.e., "END-2PA"). END-2PA corresponds to pump-probe two-photon absorption where the pump beam ($\hbar\omega_2$ in FIG. 6) is a small fraction (0.08-0.33) of the bandgap energy ($E_g$), while maintaining $\hbar(\omega_1+\omega_2) \geq Eg$. END-2PA can be used to increase the two-photon absorption coefficient, $\beta$, by up to two orders of magnitude. This technique can be used to optimize switch efficiency by proper selection of the pump and probe wavelengths for a given material.

Figure 6A:
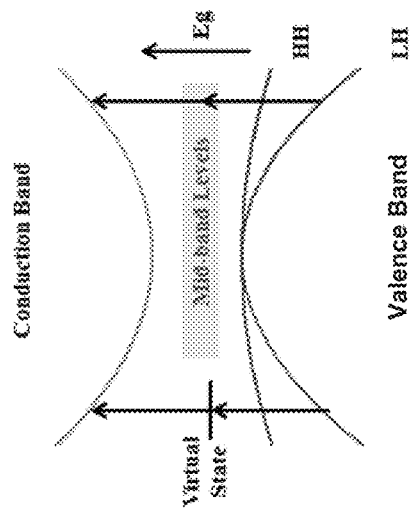
FIG. 6a shows a graph that illustrates how deep levels in the bandgap ($E_g$) of the substrate enhance the two-photon absorption.

There is also a special case of degenerate, two-photon absorption that results when the two-photon absorption is enhanced by deep energy levels located in the bandgap which are resonant, or close to resonant, with the photon energy. The deep levels can be the result of impurities and defects. FIG. 6a illustrates how deep levels in the bandgap ($E_g$) enhance the two-photon absorption. The mid-band levels located at energy of $\sim\hbar\omega$ above the valence band are at resonance with the applied photons. Valence electrons can be excited into these mid-band levels by absorbing a photon. The electrons excited into these mid-band levels have a finite lifetime at the mid-gap levels. Absorption of a second photon by an electron residing in a mid-band energy level results in the electron being excited into the conduction band. This process is very rapid and appears to be true, degenerate, two photon absorption. However, it does not involve the simultaneous absorption of two photons, as required by true two photon absorption, because of the finite lifetime of the electron located in a mid-band energy level. This increases the probability of the optical transitions of valence electrons to the conduction band by way of two-step optical absorption using mid-band levels as a stepping stone. These optical transitions utilizing the mid-band levels effectively increases and enhances the degenerate two-photon absorption (also referred to as "TPA") response. Ultimately, all two-step optical excitation of valence electrons via mid-band levels at, or near, photon resonance will appear as two-photon absorption leading to an enhanced two-photon absorption coefficient βeff.

Second Harmonic Generation (SHG) is a nonlinear optical process that can also enhance the two-photon abortion coefficient. SHG is a process where a crystalline material absorbs two photons of energy $\hbar\omega$ and generates a single photon with energy $2\hbar\omega$. Photoconductive switches are constructed from many materials that exhibit SHG which includes, among others, GaN, 4H—SiC, 6H—SiC and AlN. Second harmonic photons ($2\hbar\omega$) which have an energy greater than the bandgap ($2\hbar\omega \geq E_g$) will be quickly absorbed by the switch material generating an electron-hole pair. This action further increases the effective, degenerate, two-photon absorption coefficient ($\beta_{eff}$).

The decay of the intensity of an optical pulse as it propagates into a material is shown in equation (1) below:

$$\frac{dI(z,t)}{dz} = -\alpha I(z,t) - \beta_{eff} I^2(z,t) - \sigma_{FC} n(I(z,t)) \quad (1)$$

where "I" is the optical intensity, $\alpha$ is the linear and $\beta_{eff}$ can be either the standard two photon absorption coefficient, or, the enhanced two-photon absorption coefficient, $\sigma_{FC}$ is the free carrier absorption cross section, and n(I) is the free carrier density. The enhanced two-photon absorption is proportional to the product of the enhanced two-photon absorption coefficient, $\beta_{eff}$, and the instantaneous optical intensity I. The optical penetration depth is deep, since the applied photons have energy that is below bandgap. The ultimate penetration depth will be determined by scattering losses and $\beta_{eff}$I. Optical penetration depths similar to extrinsic photoconductive switches can be obtained.

$$\frac{\partial n(z,t)}{\partial t} = \frac{\beta_{eff} I^2(z,t)}{2\hbar\omega} - \frac{n(z,t)}{\tau_r} \quad (2)$$

Equation (2) above is the rate equation for free electrons (n(z,t)) in a material where the optical generation rate of electrons is dominated by enhanced two photon absorption. Where "$\tau_r$" is the electron recombination time. The generation rate is determined by the enhanced two-photon absorption coefficient and the optical intensity squared. So, free electron generation is determined by, $\beta_{eff}$, a fundamental material property, and the square of the chosen applied optical intensity.

The free electron decay is determined by the electron recombination rate ($n/\tau_r$) which is inversely proportional to the number density of unfilled electron traps and recombination centers containing a hole. Doping is selected in two-photon absorption nonlinear optical switches to obtain the desired recombination time, unlike extrinsic photoconductive switches where the doping impurities are selected to provide carriers when optical excitation is applied. The recombination time in a two-photon absorption, nonlinear optical switch can be tailored by doping with impurities to create deep traps and/or controlling growth conditions to produce intrinsic defects that behave as deep traps. The larger the density of unfilled deep traps, the faster the switch recombination time. The two-photon absorption, non-linear optical switch allows the carrier generation rate to be decoupled from the material doping requirements and the recombination time.

Two-photon non-linear optical switches combine the advantages of both extrinsic and intrinsic photoconductive switches: deep optical penetration depth, a wealth of carriers to be excited from the valence band into the conduction band, and a decoupling between carrier generation and material doping requirements. In addition, there is the potential of improving the performance and efficiency of optical switches based on enhancing the two-photon absorption response via END-2PA for non-degenerate two photon absorption, or mid-gap energy levels for degenerate two photon absorption. Two-photon nonlinear optical switches can be constructed from Gallium Nitride (GaN), Aluminum Nitride (AlN), Gallium Arsenide (GaAs), LT-GaAs, 4H—SiC, 6H—SiC, 2H—SiC, 3C—SiC, ZnO, ZnS, TiO2, or any other solid with suitable two-photon absorption response.

One especially attractive candidate material for the substrate 102 of the optically triggered switch 100 is 2H—GaN. This is due to 2H—GaN having a relatively large, self-two-photon absorption coefficient of ~20 cm/GW at applied optical wavelengths of 527-532 nm. An optical switch, such as switch 100 shown in FIG. 5, based on two-photon absorption, was constructed from a semi-insulating, 2H—GaN substrate. The switch was constructed with opposing electrodes similar—to the switch geometry shown in FIG. 5. A single facet of the 2H—GaN switch was irradiated with 532 nm wavelength light. The switch conductance (inverse resistance) was observed for a range of optical intensities at 532 nm. The maximum switch conductance plotted as a function of peak applied optical intensity at 532 nm is shown in FIG. 7. FIG. 7 shows that the switch conductivity is a nonlinear function of peak applied optical power at the 532 nm wavelength. The maximum switch conductance data of FIG. 7 is re-plotted versus peak optical power squared in FIG. 8 showing a linear dependence between switch conductivity and the square of peak optical power. This is the expected dependence of switch conductivity on applied optical power for an electrical switch where carriers are generated by two-photon absorption, or, enhanced two-photon absorption.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. An optical switch electrically activatable through received photon energy, the switch comprising:
   a substrate responsive to photon energy, where the photon energy forms an optical excitation signal;
   a first electrode disposed on a first surface of the substrate;
   a second electrode disposed on a second surface of the substrate; and
   wherein the substrate includes a characteristic of two-photon absorption to enable electrical conduction through the substrate, the two-photon absorption being enhanced by deep energy levels located in a bandgap between conductance and valence bands of the substrate which are at least near resonant with the photon energy.

2. The switch of claim 1, wherein a material of the substrate and at least one wavelength of the optical excitation signal may be selected to maximize two-photon absorption in the switch substrate.

3. The switch of claim 1, wherein the two-photon absorption comprises degenerate two-photon absorption.

4. The switch of claim 1, wherein the two-photon absorption comprises pumped-mode two-photon absorption.

5. The switch of claim 4, wherein the pumped-mode two-photon absorption comprises pumped, extremely non-degenerate two-photon absorption.

6. The switch of claim 1, wherein the substrate is constructed from Gallium Arsenide (GaAs).

7. The switch of claim 1, wherein the substrate is constructed from 2H—GaN.

8. The switch of claim 1, wherein the substrate is constructed from one of:
   Gallium Nitride (GaN);
   Aluminum Nitride (AlN);
   LT-GaAs;
   4H—SiC;
   6H—SiC;
   2H—SiC;
   3C—SiC;
   ZnO;
   ZnS; or
   TiO2.

9. The switch of claim 1, wherein the substrate comprises a doping which is selected to obtain a predetermined recombination time for the switch.

10. The switch of claim 1, wherein the switch comprises a non-linear, optically activated switch.

11. The switch of claim 1, wherein a recombination time of the switch is tailored by at least one of:
doping the substrate with impurities to create deep traps; and
controlling growth conditions to produce intrinsic defects that behave as deep traps.

12. The switch of claim 1, wherein the first and second electrodes are disposed on opposing parallel surfaces of the substrate.

13. A non-linear optical switch electrically activatable through received photon energy, the switch comprising:
a substrate responsive to photon energy, where the photon energy forms an optical excitation signal;
a first electrode disposed on a first surface of the substrate;
a second electrode disposed on a second surface of the substrate;
wherein the substrate includes a characteristic of two-photon absorption to enable electrical conduction through the substrate, the two-photon absorption being enhanced by deep energy levels located in a bandgap between conductance and valence bands of the substrate which are at least near resonant with the photon energy; and
wherein the substrate comprises a doping which is selected to obtain a predetermined recombination time for the switch.

14. The switch of claim 13, wherein a recombination time of the switch is tailored by at least one of:
doping the substrate with impurities to create deep traps; and
controlling growth conditions to produce intrinsic defects that behave as deep traps.

15. A method for forming an optical switch electrically activatable through received photon energy, the method comprising:
providing a substrate responsive to photon energy, where the photon energy forms an optical excitation signal;
forming a first electrode on a first surface of the substrate;
forming a second electrode on a second surface of the substrate; and
further forming the substrate such that the substrate includes a characteristic of two-photon absorption to enable electrical conduction through the substrate; and
enhancing the two-photon absorption of the substrate by deep energy levels located in a bandgap between conductance and valence bands of the substrate which are at least near resonant with the photon energy.

16. The method of claim 15, wherein a material of the substrate and at least one wavelength of the optical excitation signal are selected to maximize two-photon absorption in the substrate.

17. The method of claim 15, further comprising forming the substrate from at least one of:
Gallium Arsenide (GaAs);
2H—GaN;
Gallium Nitride (GaN);
Aluminum Nitride (AlN);
LT-GaAs;
4H—SiC;
6H—SiC;
2H—SiC;
3C—SiC;
ZnO;
ZnS; or
TiO2.

18. The method of claim 15, wherein the substrate is doped to obtain a predetermined recombination time for the switch.

19. The method of claim 15, further comprising forming the switch as a non-linear, optically activated switch.

* * * * *